United States Patent [19]

Nguyen et al.

[11] Patent Number: 5,208,189

[45] Date of Patent: May 4, 1993

[54] PROCESS FOR PLUGGING DEFECTS IN A DIELECTRIC LAYER OF A SEMICONDUCTOR DEVICE

[75] Inventors: Bich-Yen Nguyen; Philip J. Tobin, both of Austin, Tex.

[73] Assignee: Motorola, Inc., Schaumburg, Ill.

[21] Appl. No.: 769,049

[22] Filed: Sep. 30, 1991

[51] Int. Cl.$^5$ .......................................... H01L 21/443
[52] U.S. Cl. .......................... 437/238; 148/DIG. 25; 148/DIG. 43; 148/DIG. 118; 148/DIG. 81; 437/241; 437/923; 437/966; 437/983
[58] Field of Search ............. 148/DIG. 118, DIG. 25, 148/DIG. 43, DIG. 81; 437/238, 243, 978, 241, 923, 983, 966, 939

[56] References Cited

U.S. PATENT DOCUMENTS

| | | | |
|---|---|---|---|
| 3,988,824 | 11/1976 | Bodway | 437/238 |
| 4,395,438 | 7/1983 | Chiang | 437/243 |
| 5,057,463 | 10/1991 | Bryant et al. | 437/238 |
| 5,107,982 | 5/1991 | Kobayashi | 357/23.6 |

OTHER PUBLICATIONS

"Scaling Limitation of Nitride Layer for Reliable Stacked Nitride/Oxide Gate Dielectrics," Bich-Yen Nguyen et al., Extended Abstracts, The Electrochemical Society, vol. 90-2, Abstract No. 315, Oct. 1990.

Primary Examiner—George Fourson
Attorney, Agent, or Firm—Patricia S. Goddard

[57] ABSTRACT

Defects in a thin dielectric layer of a semiconductor device are plugged by a discontinuous layer to maintain integrity of the dielectric without degrading the reliability of the device. In one form of the invention, a semiconductor device (10) includes an oxide layer (14) formed on a substrate material (12). Growth of a nitride layer (18), using CVD techniques, is initiated in any defects (16) in the oxide layer, but growth is terminated prior to entering a continuous growth stage. By plugging the defects with nitride without forming a continuous nitride layer, defect density in thin oxides is reduced without experiencing disadvantages associated with thick oxide-nitride stacks. The invention is also applicable to plugging defects in dielectric layers other than oxide. Furthermore, growth of a discontinuous layer may be achieved with a material other than a nitride using CVD techniques.

21 Claims, 3 Drawing Sheets

PROCESS FOR PLUGGING DEFECTS IN A DIELECTRIC LAYER OF A SEMICONDUCTOR DEVICE

FIELD OF THE INVENTION

The present invention is generally related to a process for plugging defects in a dielectric, and more particularly to a process for plugging defects in a dielectric layer, such as an oxide, of a semiconductor device.

BACKGROUND OF THE INVENTION

Dielectric layers, such as oxides, are commonly used in semiconductor devices to electrically insulate one conductive member or conductive layer from another. For example in a transistor, a gate oxide is used to separate a gate electrode from a substrate material. In a non-volatile memory application, a tunneling oxide is used to separate a floating gate electrode from a substrate material. Oxides are also used frequently as capacitor dielectrics in semiconductor devices. In transistor, non-volatile memory, and capacitor applications, the oxide layer is very thin, typically on the order of 50-200 Å (5-20 nm). Since the oxide layer is thin, any defects in the oxide will have a significant impact on the ability of the film to adequately insulate one conductor from another. Defects which might be present in an oxide may also alter a device's electrical characteristics, including breakdown voltage, programming voltage, and charge storage capacity. For this reason, it is important that thin oxides be of high quality and essentially free of defects.

Achieving a defect-free, thin oxide film is quite difficult. Defects may be introduced into an oxide film as a result of forming the film on a contaminated surface, forming the film in a contaminated reaction chamber, or simply as a result of the growth process in general. Furthermore, once an oxide film is formed, existing defects may be made worse and new defects may be created as a result of subsequent processing. Process induced damage to an oxide layer may be caused, for example, by ion implantation through the oxide layer or by exposing a device to a damaging plasma. Defects and process induced damage adversely affect the reliability of a thin oxide layer.

One known method of reducing the negative effects of defects in an oxide film is to form a CVD (chemical vapor deposition) film on top of the oxide, for instance a CVD silicon nitride ($Si_3N_4$) film or a CVD oxide film. Depositing a CVD nitride film on a thermally grown oxide to form an oxide-nitride stack is a rather common approach to lowering defectivity. Furthermore, oxide-nitride stacks are more resistant to process induced damage in comparison to stand-alone oxides. Unfortunately, use of an oxide-nitride stack in transistors and capacitors has a significant disadvantage. Nitride films have a much higher charge trapping density than oxide films, resulting in a decrease in semiconductor device reliability, particularly as the nitride thickness increases.

A known alternative to a CVD oxide-nitride stack is a thermal oxy-nitride film formed by the nitridation of an oxide layer. Rather than being a composite of a nitride layer formed on an oxide layer, an oxy-nitride film is an oxide film which has undergone thermal nitridation, resulting in a film having a composition in the form of $Si_xO_yN_z$. Like oxide-nitride stacks, oxy-nitride films have disadvantages which make the films less than desirable for use in semiconductor devices. In particular, processes used to form oxy-nitride films are not well suited for device fabrication. For instance, the thermal reaction required to form an oxy-nitride film occurs at a high temperature, usually at a temperature above 950° C., although temperatures near 850° C. have been reported. High temperature processing in semiconductor devices is undesirable, especially if diffused regions have previously been formed in an underlying substrate material since the high temperature will modify the diffusion profile in the substrate. Furthermore, the process tolerances for forming an oxy-nitride film are very small because parameters must be kept at levels which minimize the amount of nitrogen present at the interface between a substrate material and the initial oxide film. Too much nitrogen at this interface causes an undesirable shift in a device's threshold voltage and a reduction in transconductance.

In order to successfully scale down the size of semiconductor devices, an ongoing goal in the semiconductor industry, manufacturers must develop a method of producing thin, reliable oxide films. Each of the previously mentioned approaches to improving the reliability of a thin oxide has distinct and unfortunate disadvantages. For this reason a need exists for an improved method for forming dielectric layers in semiconductor devices.

SUMMARY OF THE INVENTION

The disadvantages of existing semiconductor fabrication process are overcome, and other advantages are achieved, with the present invention. In one embodiment, a process is taught in which a semiconductor device is fabricated by forming a dielectric layer over a substrate material. Growth of a predetermined material is initiated in any defects in the dielectric layer, but is terminated prior to forming a continuous film of the predetermined material across the oxide.

These and other features, and advantages, will be more clearly understood from the following detailed description taken in conjunction with the accompanying drawings. It is important to point out that the figures are not necessarily drawn to scale and should not be construed as the only method of practicing the invention.

DETAILED DESCRIPTION OF A PREFERRED EMBODIMENT

As discussed above, producing thin dielectric layers with high reliability is an essential part of semiconductor fabrication. As semiconductor devices are made smaller, it is more difficult to produce reliable thin dielectrics. Previous attempts to overcome the effects of defects which are formed in thin dielectrics have been moderately successful, but there are disadvantages associated with each. For example, defectivity in thin oxide layers have been reduced by depositing a nitride layer on top of the oxide, forming an oxide-nitride stack. However, oxide-nitride stacks have a high charge trapping density at the nitride interface, thereby decreasing reliability of the stack. A process of reacting an oxide layer in a nitrogen ambient to form an oxy-nitride compound is another known method of controlling oxide defects; however, such compounds are very difficult to fabricate controllably and many of the fabrication techniques negatively affect other aspects of the semiconductor device.

The present invention overcomes many of the disadvantages of the prior art and offsets the effects of defects in dielectric layers by plugging these defects with another dielectric material. In one form of the invention, an oxide layer is grown or deposited onto a substrate material. The substrate and oxide layer then undergo a short nitride deposition using a CVD process which is terminated prior to the formation of a continuous nitride film on the oxide layer. In essence, nitride growth is initiated by forming small nitride islands in and above any defects which might be present in the oxide layer, thereby plugging the defects. Nitride is formed first in the defects because defects in the oxide are the lowest energy sites of the film. Nitride growth, however, is terminated before a continuous film is formed so that reliability of the oxide is maintained. Since there is not a significant thickness of nitride present on the oxide layer, problems associated with high charge trapping density are avoided.

Figure 1:
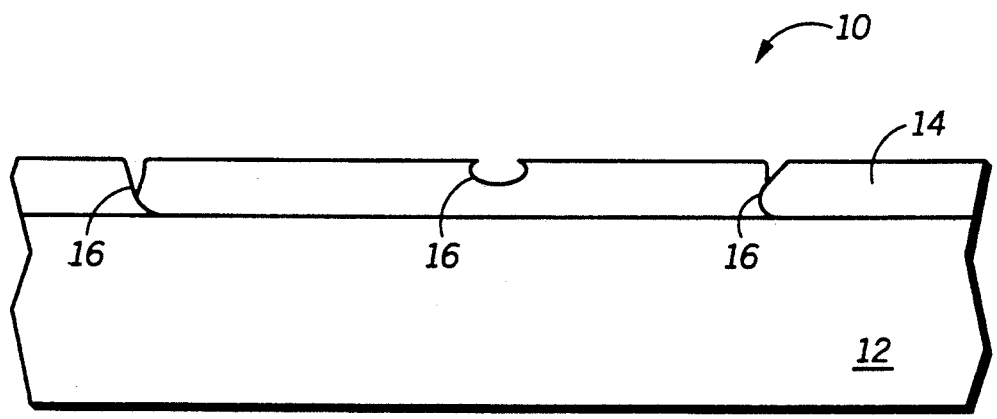
FIGS. 1-5 are cross-sectional illustrations of a portion of a semiconductor device which depict formation of a discontinuous film in accordance with the present invention.

Illustrated in FIGS. 1-5 is a series of semiconductor fabrication steps in accordance with one embodiment of the present invention. A portion of a semiconductor device 10 is illustrated in FIG. 1, the device having a substrate 12 with an overlying oxide layer 14. In most semiconductor devices, substrate 12 is a monocrystalline silicon wafer, although any substrate material is suitable for use in the present invention. Oxide layer 14 may either be grown on or deposited over substrate 12 using a known technique. As an example, oxide layer 14 may be a silicon dioxide ($SiO_2$) layer either thermally grown on a silicon substrate or deposited on a substrate using chemical vapor deposition (CVD). While the discussion of FIGS. 1-5 is directed to a semiconductor device having an oxide layer, such as oxide layer 14, the present invention is beneficial to other dielectric layers in semiconductor devices. As one example, the invention can be used to plug defects in a nitride layer.

Incorporated into oxide layer 14 are defects 16. Defects in dielectric films are an inherent consequence of film formation, but defect formation is often enhanced as a result of forming the dielectric on a contaminated substrate surface or with a loosely controlled process. Defects in dielectric films can take several forms. The defects illustrated in FIG. 1 are not intended to limit the invention to any particular type of defect which might form, but are instead intended to represent all types defects. In addition, the number of defects illustrated is merely representative, and those defects illustrated are not necessarily drawn to scale.

Oxide layer 14 is preferably on the order of 300 Å (30 nm) or less in order to achieve the most benefit from the present invention. Oxide thickness above 300 Å (30 nm) do not have the significant yield problems associated with defects, as do thin oxides, because defect density decreases as oxide thickness increases. However, from an operability standpoint, the present invention may be used in conjunction with any oxide or dielectric thickness. In other words, the present invention can successfully be implemented on thick dielectrics; however, the benefit in using the invention decreases as dielectric thickness increases.

Figure 2:
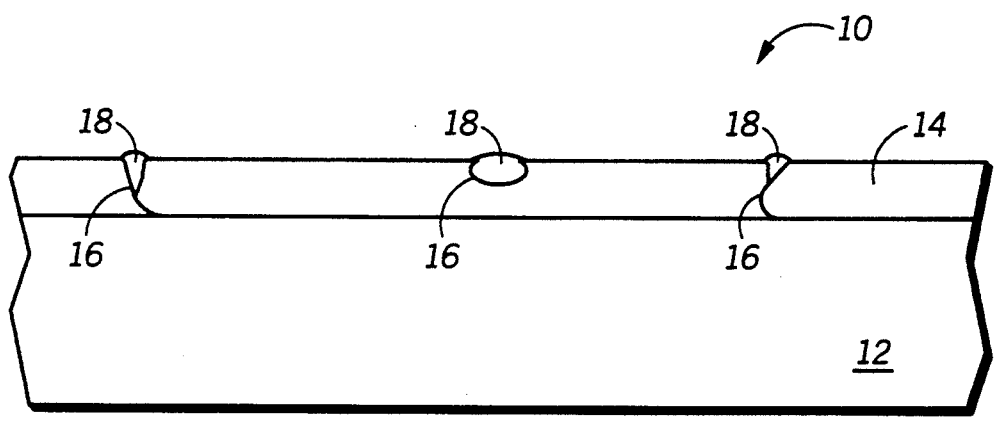
Figure 3:
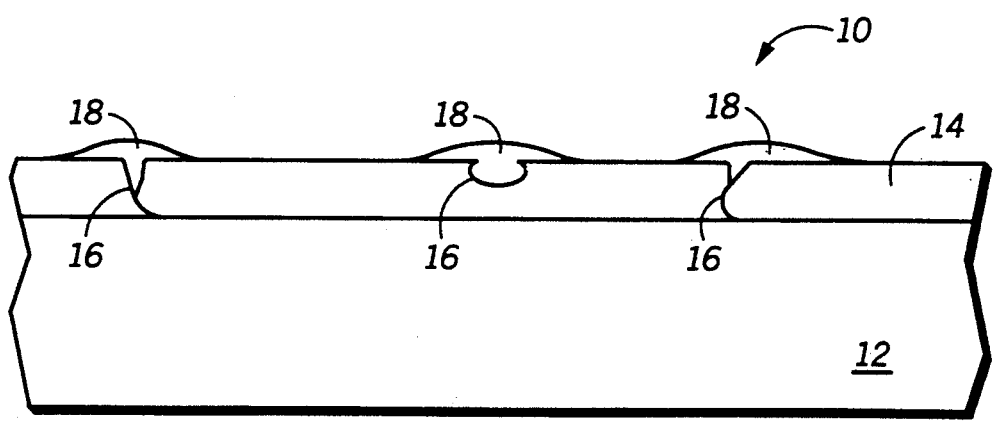
Figure 4:
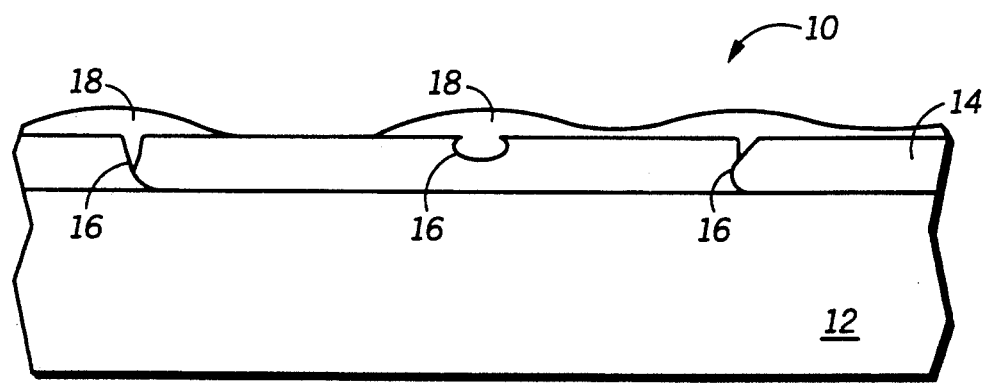

After forming oxide layer 14, substrate 12 is subjected to an ambient of nitrogen and silicon gas species to initiate growth of silicon nitride ($Si_3N_4$) using chemical vapor deposition. In an initial stage of growth, small $Si_3N_4$ islands 18 form in defects 16, as illustrated in FIG. 2. Growth of $Si_3N_4$ begins at defect regions of oxide layer 14 because surface migration of silicon atoms and nitrogen atoms results in formation of $Si_3N_4$ nuclei at the lowest possible energy sites, namely at the defect regions of oxide layer 14. Continued growth of the nuclei produces islands 18. As growth proceeds, islands 18 become larger, as illustrated in FIG. 3, and eventually begin to merge together, as illustrated in FIG. 4. Further progression of nitride growth results in a continuous $Si_3N_4$ film 20, illustrated in FIG. 5.

As discussed earlier, continuous nitride films formed on an oxide increase charge trapping density and are therefore undesirable for use as gate dielectrics in semiconductor devices. For this reason, the present invention requires that growth of $Si_3N_4$ be terminated prior to the formation of a continuous film. The onset of continuous growth of a nitride film is readily detectably by measuring the thickness of nitride at various times throughout the deposition process. Upon plotting nitride thickness as a function of deposition time, a distinct change in slope, which corresponds to a change in nitride deposition rate, is evident. The point where the nitride deposition rate changes corresponds to the onset of a continuous growth stage.

Figure 6:
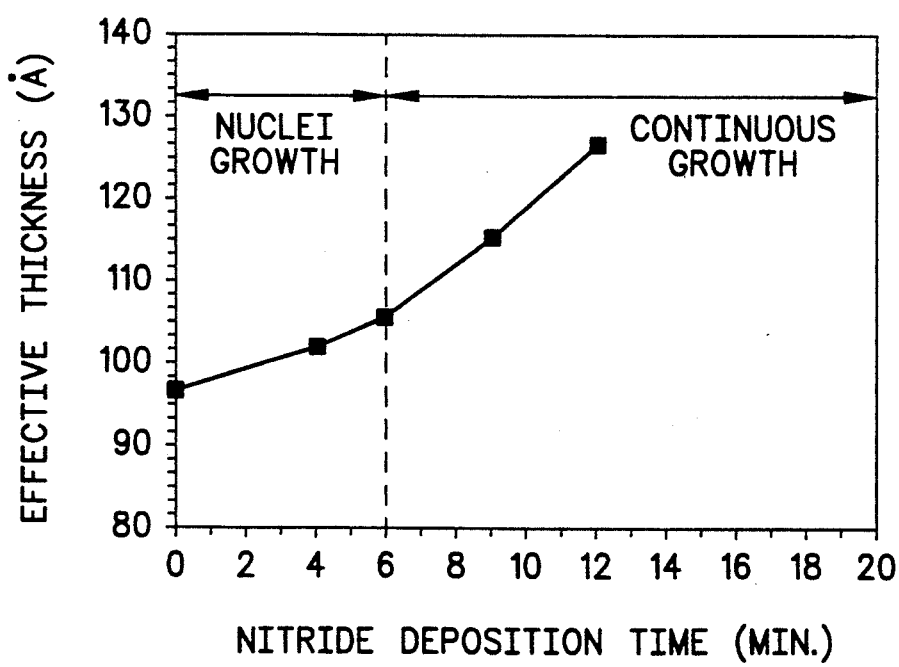
FIGS. 6 and 7 are graphs which illustrate growth behavior of CVD (chemical vapor deposition) nitride films, and more particularly which illustrate nuclei and continuous growth stages of nitride films.

To illustrate the two stages of nitride growth, namely a nuclei growth stage and a continuous growth stage, effective nitride thickness as a function of deposition time is plotted in the graph of FIG. 6. To obtain these data points, an oxide film having a nominal thickness of 97Å (9.7 nm) was thermally grown on several undoped silicon substrates. The substrates were then placed in a CVD nitride deposition chamber (specifically a Bruce furnace, Model 7355 DDC) and deposition of a nitride film was initiated. Process parameters for the CVD deposition were as follows: $NH_3$ gas at a flow rate of 200 mL/minute; $SiH_2Cl_2$ gas at a flow rate of 10 mL/minute; chamber pressure at 600 mtorr; and chamber temperature at 720° C. Depositions lasting four, six, nine, and twelve minutes were performed and the resulting combined thickness of the nitride film and the underlying oxide layer was measured using capacitance-voltage measurements, assuming a dielectric constant value equal to that of silicon dioxide ($SiO_2$). To determine the effective thickness of the nitride film alone, the thickness of the oxide layer (97Å) is subtracted from the effective thickness of both layers, which is plotted in FIG. 6.

Figure 5:
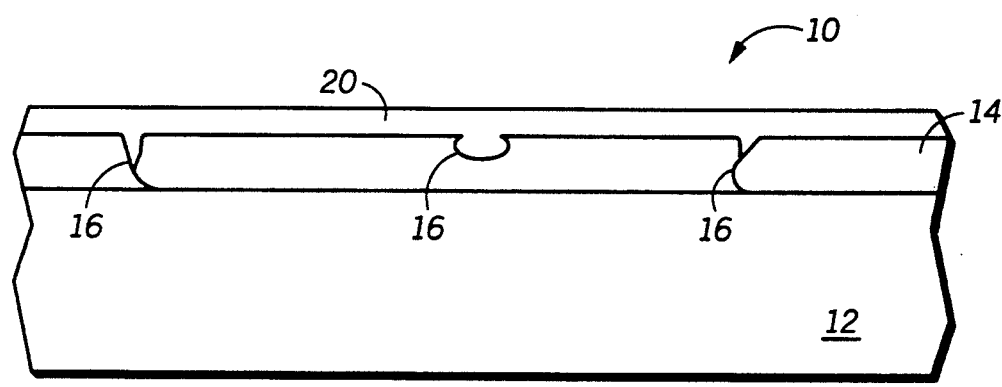

As evidenced in FIG. 6, the nitride growth process has a low growth stage below a deposition time of six minutes and a high growth stage above a deposition time of six minutes. These two growth stages are more descriptively referred to as "nuclei growth" and "continuous growth," respectively. The term "nuclei growth" refers to the fact that during this stage in growth, small islands of nitride nucleate on portions of an underlying oxide layer, for example, as illustrated in FIG. 2 and FIG. 3. The term "continuous growth" is attributable to the fact that the small islands of nitride formed initially merge with one another to form a continuous nitride film, as depicted in FIG. 4 and FIG. 5.

Figure 7:
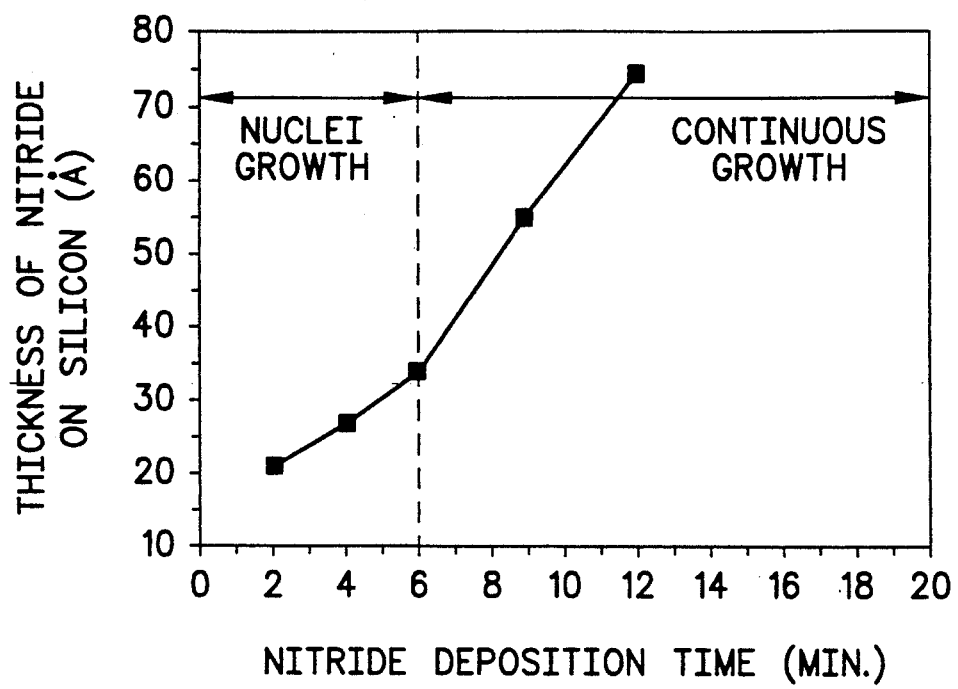

While the graph of FIG. 6 demonstrates the low and high growth stages as determined from the effective thickness of an oxide and a nitride film, FIG. 7 confirms that the two distinct growth stages are in fact governed by nitride deposition. The points plotted in FIG. 7 represent the thickness of a nitride film deposited on a bare silicon substrate under the previously described CVD process, unlike FIG. 6 which plots effective thickness of a combined oxide-nitride stack. Thickness measurements of the individual nitride film deposited on bare silicon were taken at two, four, six, nine, and twelve minutes of deposition using an ellipsometer. While the nitride growth rates in FIG. 7 are clearly different than the rates illustrated in FIG. 6, evidenced by the different slopes of the two curves, both graphs demonstrate an onset of continuous growth at a deposition time of six minutes.

It is important to realize, however, that the amount of time necessary to reach a transition point between the nuclei growth and continuous growth stages is not always after a deposition time of six minutes. A transition point in time of the nitride deposition process will be dependent on various parameters including gas flow rates, size of the deposition chamber, chamber pressure, gas temperature, and type of gases used, among others.

Figure 8:
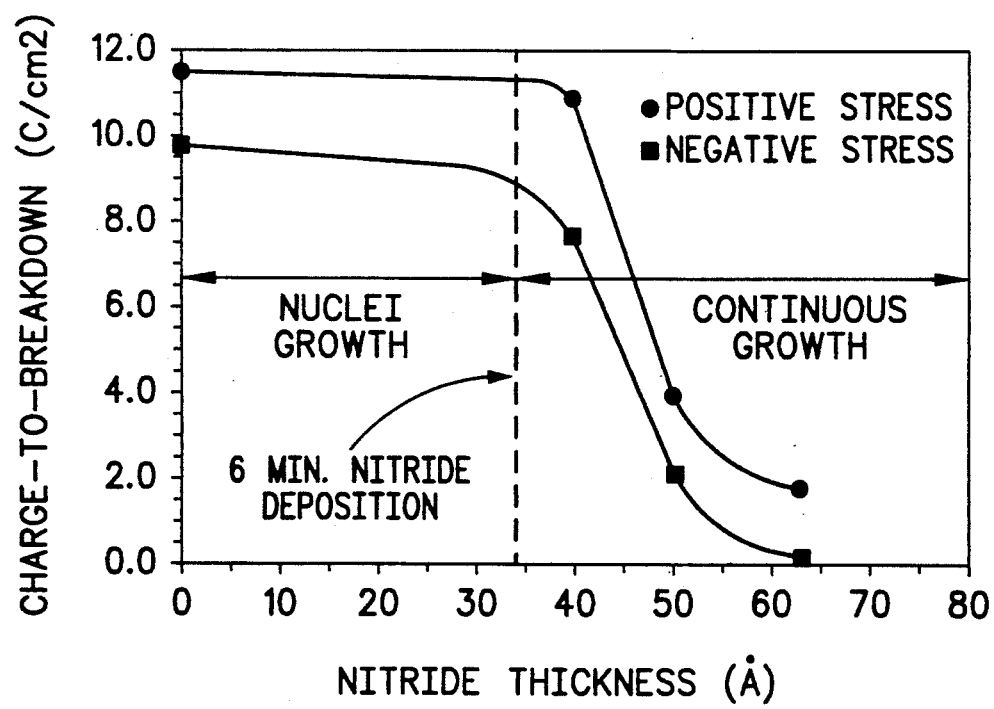
FIG. 8 is a graph illustrating a decrease in the ability of a nitride film to resist breakdown as film thickness increases.

As discussed above, it is important in practicing the invention that a nitride deposition process be kept within the nuclei growth stage. Upon reaching a continuous growth stage, the increase in nitride film thickness degrades the ability of the dielectric to resist breakdown under charge injection. Degradation of a dielectric as nitride thickness increases is illustrated in the graph of FIG. 8. Charge-to-breakdown measurements of a capacitor having a $Si_3N_4$ dielectric were recorded for several different nitride thicknesses. Measurements were taken under both positive stress (positive biasing conditions) and negative stress (negative biasing conditions). Under both stress conditions, a dramatic degradation in the nitride film occurs beyond a thickness of about 40Å (4 nm). The dashed line in FIG. 8 represents a thickness of about 34Å (3.4 nm), which corresponds to a six minute deposition time with respect to FIG. 7. Accordingly, nitride thickness to the left of the dashed line in FIG. 8 can be considered as nitride grown completely within the nuclei growth stage, while thicknesses to the right can be considered as nitride films which have entered a continuous growth stage. From the data, it is understandable why, in practicing the invention, it is important to terminate the nitride deposition process prior to significantly entering the continuous growth stage.

Process tolerances for practicing the invention is reasonably large. Process parameters will vary widely depending upon the equipment used. As a rough guideline, a range of suitable parameters is provided; however, the values subsequently given are not intended to restrict the invention. If nitride deposition is achieved by a CVD technique, suitable source gases include ammonia ($NH_3$) as a nitrogen gas species and any silane-based chemistry as a silicon gas species. Silane-based gases include silane ($SiH_4$), dichlorosilane ($SiH_2Cl_2$), and trichlorosilane ($SiHCl_3$). Flow rates of the source gases will vary and are dependent on the size and type of deposition chamber used. Gas ratios between the nitrogen gas species and the silicon gas species are dependent upon the exact source gases chosen, but generally can range from approximately a ratio of 3:1 to 20:1 (nitrogen species:silicon species). Suitable CVD deposition temperatures typically range from 400°–800° C., while pressures may range from 200–800 mtorr. Although deposition times in accordance with the present invention need to be determined according to changes in deposition rate of a nitride film, it is anticipated that most nitride deposition times using CVD methods will be less than twenty minutes in duration. CVD techniques, however, are not the only suitable method of depositing a nitride film to plug oxide defects in accordance with the invention. Depositions which utilize silicon and nitrogen containing plasmas may also be used.

While the previous discussion has primarily dealt with using CVD $Si_3N_4$ to plug defects in a dielectric layer, it is important to realize that other CVD films may be used in accordance with the invention. Presence of two distinct film growth stages, namely a nuclei growth stage and a continuous growth stage, is evident in other CVD materials. Therefore, other dielectric materials deposited by CVD techniques in the nuclei growth stage, in accordance with the present invention, may adequately plug defects without degrading quality or reliability of the initial dielectric layer. As an example, a CVD oxide deposition kept within a nuclei growth stage may be used to plug defects in an underlying oxide or nitride layer. Factors which will determine if a CVD dielectric material is suitable for plugging defects in an underlying dielectric include the surface diffusion rate of the CVD dielectric material atoms on the underlying dielectric surface and the sticking coefficient of these atoms. In order to plug defects in the underlying dielectric layer, preferably the CVD dielectric material is chosen such that surface diffusion rate is maximized while the sticking coefficient is minimized.

The foregoing description and illustrations contained herein demonstrate many of the advantages associated with the present invention. In particular, it has been revealed that dielectric defects can be filled by islands of material which nucleate at the defect sites, thereby lowering defect density of dielectric layer. Use of the invention is particularly beneficial in fabricating semiconductor devices having dielectric thicknesses below 300Å (30 nm), since thin dielectric generally have the highest defectivity levels. In addition to improving dielectric quality, the present invention can be practiced using conventional CVD deposition equipment and processes. Furthermore, implementing the invention need not excessively increase fabrication time of a semiconductor device. If fabrication time is critical, a CVD deposition of a material to fill defects, in accordance with the present invention, can be performed in-situ following a CVD deposition of the initial dielectric layer. Yet another advantage is the invention can be accomplished at temperatures conventionally considered low (below 800° C.), such that diffusion profiles in a substrate material are not adversely affected.

Thus it is apparent that there has been provided, in accordance with the invention, a process for plugging defects in a dielectric layer of a semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention.

For example, a dielectric film formed in accordance with the invention is not limited to a $SiO_2$ layer, but may be any type of dielectric used in semiconductor devices, including $Al_2O_3$, $Ta_2O_5$, $TiO_2$, $GeO_2$, and the like. In addition, the invention is not limited to a particular method for forming a dielectric layer. Thermally grown oxides, oxides deposited by CVD, and other dielectric deposition methods are encompassed by the present invention. Nor is deposition of a nitride film limited to CVD methods, but also includes plasma deposition techniques. It is also important to note that the present invention is not limited in any way to a specific amount of time for depositing a nitride film, but is instead limited to nitride deposition during a nuclei growth stage. The nuclei growth stage is considered the first and slower growth stage of two stages of nitride film growth, as explained above. Furthermore, the invention is not limited to using nitride as the defect plugging material. As stated earlier, other dielectric materials also exhibit the two growth stages demonstrated in FIGS. 6 and 7, enabling materials other than $Si_3N_4$ to be used to plug dielectric defects. As an example, $SiO_2$ may be used to plug the defects in accordance with the present invention, provided growth is maintained within a nuclei growth stage. Therefore, it is intended that this invention encompass all such variations and modifications as fall within the scope of the appended claims.

We claim:

1. A process of plugging defects in a dielectric layer of a semiconductor device, comprising the steps of:
   providing a substrate material;
   forming an dielectric layer on the substrate material;
   after forming the dielectric layer, initiating growth of a predetermined material in any defects in the dielectric layer; and
   terminating growth of the predetermined material prior to forming a continuous film of the predetermined material across the dielectric layer.

2. The process of claim 1 wherein the step of initiating growth of a predetermined material comprises initiating growth of a predetermined material using chemical vapor deposition.

3. The process of claim 2 wherein the step of initiating growth of a predetermined material comprises initiating growth of a nitride layer.

4. The process of claim 3 wherein the step of initiating growth of a nitride layer comprises initiating growth of a nitride layer using a nitrogen bearing gas species and a silicon bearing gas species.

5. The process of claim 4 wherein the step of initiating growth of a nitride layer comprises initiating growth of a nitride layer using an ammonia source gas and a source gas comprising silicon and hydrogen.

6. The process of claim 1 wherein the step of terminating growth of the predetermined material comprises:
   determining an amount of time required to cause an increase in a deposition rate of the predetermined material; and
   terminating growth of the predetermined material prior to expiration of the amount of time.

7. The process of claim 6 wherein the step of initiating growth of a predetermined material comprises initiating growth of a silicon nitride layer using chemical vapor deposition.

8. A process for plugging defects in a dielectric layer of a semiconductor device, comprising the steps of:
   providing a substrate material;
   forming an oxide layer overlying the substrate material;
   exposing the oxide layer to an ambient of nitrogen and silicon bearing gas species to initiate growth of a nitride film in any defects in the oxide layer;
   determining a transition point in a deposition rate curve of the nitride film which represents an end of a nuclei growth stage of the nitride film and a beginning of a continuous growth stage of the nitride film; and
   terminating exposure of the oxide layer to the ambient prior to the transition point in time.

9. The process of claim 8 wherein the step of forming an oxide layer comprises forming an oxide layer having a thickness not greater than 300Å.

10. The process of claim 9 wherein the step of forming an oxide layer comprises forming a gate oxide layer.

11. The process of claim 8 wherein the step of exposing the oxide layer comprises initiating growth of a nitride film in any defects in the oxide layer by chemical vapor deposition.

12. The process of claim 11 wherein the step of initiating growth of a nitride film by chemical vapor deposition comprises initiating growth of a nitride film by chemical vapor deposition using a combination of an ammonia gas and a gas comprising silicon and hydrogen.

13. A process of plugging defects in a dielectric layer of a semiconductor device, comprising the steps of:
   providing a silicon substrate;
   forming an oxide layer on the silicon substrate, the oxide layer having a thickness not greater than 300Å;
   placing the substrate with the oxide layer in a reaction chamber;
   introducing an ammonia gas and a gas comprising silicon into the reaction chamber;
   reacting the ammonia gas and the gas comprising silicon to initiate growth of a nitride film on the oxide layer; and
   terminating the reaction of the ammonia gas and the gas comprising silicon prior to entering a stage of continuous growth of the nitride film.

14. The process of claim 13 wherein the step of introducing a gas comprising silicon comprises introducing a gas selected from the group of gases consisting of $SiH_2Cl_2$, $SiHCl_3$, and $SiH_4$.

15. The process of claim 13 wherein the step of forming an oxide layer comprises thermally growing an oxide on the silicon substrate.

16. The process of claim 13 wherein the step of forming an oxide layer comprises depositing an oxide on the silicon substrate using chemical vapor deposition.

17. The process of claim 13 wherein the step of reacting comprises reacting the gases in a reaction chamber at a temperature substantially in the range of 400°–900° C.

18. The process of claim 13 wherein the step of reacting comprises reacting the gases in a reaction chamber at a pressure substantially in the range of 200–800 mtorr.

19. A process of plugging defects in a dielectric layer of a semiconductor device, comprising the steps of:
   providing a semiconductor substrate material;
   forming a dielectric layer on the substrate material;
   after forming the dielectric layer, initiating growth of a predetermined material in any defects in the dielectric layer, the growth of the predetermined material having an initial growth rate;

terminating growth of the predetermined material prior to an increase in the initial growth rate.

20. The process of claim 19 wherein the step of initiating growth of a predetermined material comprises initiating growth of a predetermined material using chemical vapor deposition.

21. The process of claim 20 wherein the step of initiating growth of a predetermined material comprises initiating growth of a nitride.

* * * * *